United States Patent
Cho et al.

(10) Patent No.: US 8,809,932 B2
(45) Date of Patent: Aug. 19, 2014

(54) SEMICONDUCTOR MEMORY DEVICE, METHOD OF FABRICATING THE SAME, AND DEVICES EMPLOYING THE SEMICONDUCTOR MEMORY DEVICE

(75) Inventors: Byung-Kyu Cho, Seoul (KR); Se-Hoon Lee, Yongin-si (KR); Kyu-Charn Park, Pyeongtaek-si (KR); Choong-Ho Lee, Seongnam-si (KR)

(73) Assignee: Samsung Electronics Co., Ltd. (KR)

( * ) Notice: Subject to any disclaimer, the term of this patent is extended or adjusted under 35 U.S.C. 154(b) by 1931 days.

(21) Appl. No.: 11/822,548

(22) Filed: Jul. 6, 2007

(65) Prior Publication Data
US 2008/0237685 A1    Oct. 2, 2008

(30) Foreign Application Priority Data
Mar. 26, 2007    (KR) .................. 10-2007-0029185

(51) Int. Cl.
*H01L 29/788*    (2006.01)
*H01L 27/115*    (2006.01)
*H01L 21/28*    (2006.01)
*H01L 29/66*    (2006.01)

(52) U.S. Cl.
CPC .... *H01L 21/28273* (2013.01); *H01L 27/11521* (2013.01); *H01L 27/115* (2013.01); *H01L 29/66825* (2013.01)
USPC ............. 257/316; 257/E27.103; 257/E29.129

(58) Field of Classification Search
USPC .................. 257/316, 315, E27.103, E29.129
See application file for complete search history.

(56) References Cited

U.S. PATENT DOCUMENTS

| | | | |
|---|---|---|---|
| 5,611,038 A * | 3/1997 | Shaw et al. ............... | 715/202 |
| 6,235,589 B1 * | 5/2001 | Meguro .................. | 438/267 |
| 6,403,494 B1 * | 6/2002 | Chu et al. ................ | 438/719 |
| 6,878,985 B2 | 4/2005 | Arai et al. | |
| 7,042,770 B2 | 5/2006 | Lee et al. | |

(Continued)

FOREIGN PATENT DOCUMENTS

| | | |
|---|---|---|
| JP | 2002-016154 | 1/2002 |
| JP | 2005340853 A | 12/2005 |

(Continued)

OTHER PUBLICATIONS

Korean Office Action dated May 29, 2013 for corresponding Korean Application No. 10-2007-0070368.

*Primary Examiner* — John C Ingham
(74) *Attorney, Agent, or Firm* — Harness, Dickey & Pierce, PLC

(57) ABSTRACT

In one embodiment, the semiconductor memory device includes a semiconductor substrate having projecting portions, a tunnel insulation layer formed over at least one of the projecting semiconductor substrate portions, and a floating gate structure disposed over the tunnel insulation layer. An upper portion of the floating gate structure is wider than a lower portion of the floating gate structure, and the lower portion of the floating gate structure has a width less than a width of the tunnel insulating layer. First insulation layer portions are formed in the semiconductor substrate and project from the semiconductor substrate such that the floating gate structure is disposed between the projecting first insulation layer portions. A dielectric layer is formed over the first insulation layer portions and the floating gate structure, and a control gate is formed over the dielectric layer.

34 Claims, 17 Drawing Sheets

(56) References Cited

U.S. PATENT DOCUMENTS

| | | |
|---|---|---|
| 7,072,214 B2 | 7/2006 | Jeong et al. |
| 7,161,838 B2 * | 1/2007 | Mei et al. .................. 365/185.24 |
| 7,485,501 B2 * | 2/2009 | Takiar et al. .................. 438/127 |
| 7,508,026 B2 * | 3/2009 | Iino et al. ...................... 257/317 |
| 7,541,240 B2 * | 6/2009 | Pham et al. .................... 438/257 |
| 7,700,989 B2 * | 4/2010 | Ahn et al. ...................... 257/310 |
| 2002/0072197 A1* | 6/2002 | Kang et al. .................... 438/424 |
| 2003/0045082 A1 | 3/2003 | Eldridge et al. |
| 2004/0238881 A1* | 12/2004 | Ozawa .......................... 257/316 |
| 2006/0094191 A1* | 5/2006 | Choi et al. .................... 438/261 |
| 2006/0231900 A1* | 10/2006 | Lee et al. ...................... 257/368 |

FOREIGN PATENT DOCUMENTS

| | | |
|---|---|---|
| KR | 10-0335999 B1 | 1/2002 |
| KR | 2006-041489 | 2/2006 |
| KR | 1020060111184 | 10/2006 |

* cited by examiner

SEMICONDUCTOR MEMORY DEVICE, METHOD OF FABRICATING THE SAME, AND DEVICES EMPLOYING THE SEMICONDUCTOR MEMORY DEVICE

FOREIGN PRIORITY INFORMATION

A claim of priority under 35 U.S.C. 119 is made to Korean Application No. 10-2007-29185, filed Mar. 26, 2007, the entire contents of which are hereby incorporated by reference.

BACKGROUND OF THE INVENTION

The present invention relates to a semiconductor memory device, a method of fabricating the same, and devices employing the semiconductor memory device.

Non-volatile memory devices retain stored information even when not powered. One example of a non-volatile memory device is a flash memory. Many non-volatile memories have a memory cell array structure where the memory cells are floating gate transistors. Generally, these memory cells include a floating gate disposed between a semiconductor substrate and a control gate. A tunnel insulation layer often separates the floating gate from the semiconductor substrate. A drain and source are generally disposed on either side of the floating gate in the semiconductor substrate. During operation, charges are injected into or pulled from the floating gate by application of voltages to the control gate, drain and/or source.

A potential Vfg of the floating gate when a write potential Vcg is applied to the control gate is determined by capacitive coupling as represented by equations 1 and 2 below:

$$Vfg = Cr(Vcg - Vt - Vt0) \quad (1)$$

$$Cr = Cip/(Cip + Ctun) \quad (2)$$

where Vt is the present cell transistor threshold value, Vt0 is the threshold value (neutral threshold value) when no electric charge is stored in the floating gate, and Cr is the capacitive coupling ratio of the memory cell. As shown by equation 2, the capacitive coupling ratio Cr depends on i) the capacitance Cip between the control gate and the floating gate and ii) the capacitance Ctun between the floating gate and the semiconductor substrate.

As Vfg rises, an electric field acting on the tunnel insulation layer increases, and this facilitates injection of electric charge into the floating gate. In addition, according to the above equations, when Vcg is constant, Vfg increases in proportion to a capacitance ratio Cr. That is, when this capacitance ratio Cr is large, a Vfg large enough to move electric charge can be obtained even if the write potential Vcg is decreased. As a consequence, the write potential can be reduced.

SUMMARY OF THE INVENTION

The present invention relates to a semiconductor memory device.

In one embodiment, the semiconductor memory device includes a semiconductor substrate having projecting portions, a tunnel insulation layer formed over at least one of the projecting semiconductor substrate portions, and a floating gate structure disposed over the tunnel insulation layer. An upper portion of the floating gate structure is wider than a lower portion of the floating gate structure, and the lower portion of the floating gate structure has a width less than a width of the tunnel insulating layer. First insulation layer portions are formed in the semiconductor substrate and project from the semiconductor substrate such that the floating gate structure is disposed between the projecting first insulation layer portions. A dielectric layer is formed over the first insulation layer portions and the floating gate structure, and a control gate is formed over the dielectric layer.

Another embodiment of the semiconductor memory device includes a semiconductor substrate, and a floating gate structure disposed over the substrate. An upper portion of the floating gate structure is wider than a lower portion of the floating gate structure. First insulation layer portions are formed in the semiconductor substrate and project from the semiconductor substrate such that the floating gate structure is disposed between the projecting first insulation layer portions, and an upper surface of the floating gate structure is below an upper surface of the projecting first insulation layer portions. A dielectric layer is formed over the first insulation layer portions and the floating gate structure. A control gate is formed over the dielectric layer.

A further embodiment of the semiconductor memory device includes a semiconductor substrate, and a floating gate structure disposed over the substrate. An upper portion of the floating gate structure is wider than a lower portion of the floating gate structure. First insulation layer portions are formed in the semiconductor substrate and project from the semiconductor substrate such that the floating gate is disposed between the projecting first insulation layer portions. The projecting first insulation layer portions define a recess exposing an upper portion of the floating gate structure. A dielectric layer is formed over the first insulation layer portions and the floating gate structure such that the dielectric layer is formed in at least a portion of the recess. A control gate is formed over the dielectric layer.

The present invention also relates to a method of forming a semiconductor memory device.

In one embodiment, the method includes forming a floating gate structure on a semiconductor substrate using a mask pattern, and etching a lower portion of the floating gate structure such that the lower portion of the floating gate structure is less wide than an upper portion of the floating gate structure. In this embodiment, the method further includes forming a first insulation layer over the semiconductor substrate, etching the first insulation layer to expose the mask pattern, etching the mask pattern to create a recess defined by the first insulation layer that exposes the floating gate structure, forming a dielectric layer over the first insulation layer such that the dielectric layer is formed in at least a portion of the recess, and forming a control gate over the dielectric layer.

In another embodiment, the method includes forming a first floating gate over a semiconductor substrate using a mask pattern, forming a first insulation layer over the semiconductor substrate, etching the first insulation layer to expose the mask pattern, etching the mask pattern to create a first recess defined by the first insulation layer that exposes the first floating gate, and forming a second floating gate layer over the semiconductor substrate such that the second floating gate layer fills at least a portion of the first recess. In this embodiment, the method further includes etching the second floating gate layer to form a second floating gate such that a second recess is defined by the first insulation layer that exposes the second floating gate. A dielectric layer is formed over the first insulation layer such that the dielectric layer is formed in at least a portion of the second recess, and a control gate is formed over the dielectric layer.

The present invention still further relates to a memory device that includes a memory array having an array of memory cells, and each memory cell is configured according to one of the above described embodiments. Control circuitry is configured to read data from and write data to the memory array.

The present invention also relates to a memory system including a memory device and a memory controller. The memory controller is configured to control the memory device.

The memory device includes an array of memory cells, and each memory cell is configured according to one of the above described embodiments.

The present invention further relates to a processing system.

In one embodiment, the processing system includes a central processing unit and a memory device operatively connected to the central processing system. The memory device includes a memory array having an array of memory cells, and each memory cell is configured according to one of the above described embodiments.

BRIEF DESCRIPTION OF THE DRAWINGS

The present invention will become more fully understood from the detailed description given herein below and the accompanying drawings which are given by way of illustration only, wherein like reference numerals designate corresponding parts in the various drawings, and wherein.

DETAILED DESCRIPTION OF EXAMPLE EMBODIMENTS

Figure 1:
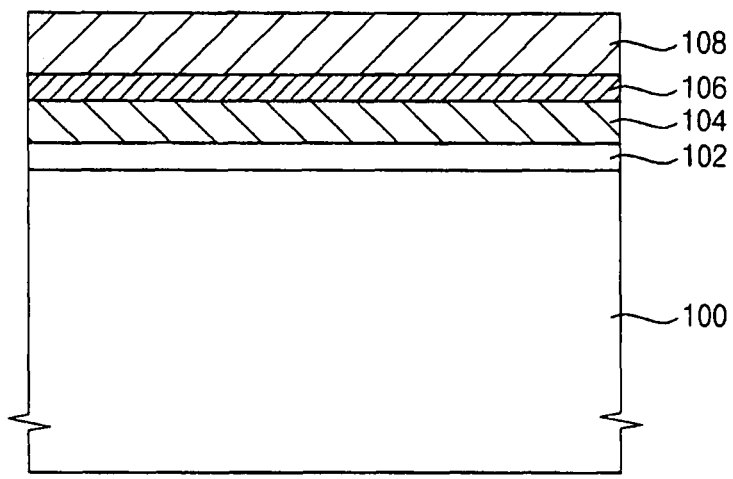
FIGS. 1-10 illustrate an example embodiment of a method for forming a semiconductor memory device.

Example embodiments will now be described more fully with reference to the accompanying drawings. However, example embodiments may be embodied in many different forms and should not be construed as being limited to the example embodiments set forth herein. Example embodiments are provided so that this disclosure will be thorough, and will fully convey the scope to those who are skilled in the art. In some example embodiments, well-known processes, well-known device structures, and well-known technologies are not described in detail to avoid the unclear interpretation of the example embodiments. Throughout the specification, like reference numerals in the drawings denote like elements.

It will be understood that when an element or layer is referred to as being "on", "connected to" or "coupled to" another element or layer, it may be directly on, connected or coupled to the other element or layer, or intervening elements or layers may be present. In contrast, when an element is referred to as being "directly on," "directly connected to" or "directly coupled to" another element or layer, there may be no intervening elements or layers present. As used herein, the term "and/or" includes any and all combinations of one or more of the associated listed items.

It will be understood that, although the terms first, second, third, etc. may be used herein to describe various elements, components, regions, layers and/or sections, these elements, components, regions, layers and/or sections should not be limited by these terms. These terms may be only used to distinguish one element, component, region, layer or section from another region, layer or section. Thus, a first element, component, region, layer or section discussed below could be termed a second element, component, region, layer or section without departing from the teachings of the example embodiments.

Spatially relative terms, such as "beneath", "below", "lower", "above", "upper" and the like, may be used herein for ease of description to describe one element or feature's relationship to another element(s) or feature(s) as illustrated in the figures. It will be understood that the spatially relative terms may be intended to encompass different orientations of the device in use or operation in addition to the orientation depicted in the figures. For example, if the device in the figures is turned over, elements described as "below" or "beneath" other elements or features would then be oriented "above" the other elements or features. Thus, the example term "below" can encompass both an orientation of above and below. The device may be otherwise oriented (rotated 90 degrees or at other orientations) and the spatially relative descriptors used herein interpreted accordingly.

The terminology used herein is for the purpose of describing particular example embodiments only and is not intended to be limiting. As used herein, the singular forms "a", "an" and "the" may be intended to include the plural forms as well, unless the context clearly indicates otherwise. It will be further understood that the terms "comprises" and/or "comprising," when used in this specification, specify the presence of stated features, integers, steps, operations, elements, and/or components, but do not preclude the presence or addition of one or more other features, integers, steps, operations, elements, components, and/or groups thereof.

Unless otherwise defined, all terms (including technical and scientific terms) used herein have the same meaning as commonly understood by one of ordinary skill in the art. It will be further understood that terms, such as those defined in commonly used dictionaries, should be interpreted as having a meaning that is consistent with their meaning in the context of the relevant art and will not be interpreted in an idealized or overly formal sense unless expressly so defined herein.

FIGS. 1-10 illustrate an example embodiment of a method for forming a semiconductor memory device. In particular, FIGS. 1-10 illustrate the formation of a memory cell for a non-volatile memory. As shown in FIG. 1, a tunnel insulation layer 102, a first floating gate layer 104, a second floating gate layer 106 and/or a hard mask layer 108 are sequentially formed over a semiconductor substrate 100. For example, the semiconductor substrate 100 may be a silicon substrate. The tunnel insulation layer 102 may be an oxide layer. For example, the tunnel insulation layer 102 may be a silicon oxide layer formed by thermal oxidation of the semiconductor substrate 100. The tunnel insulation layer 102 may be formed to a thickness of 80 Angstroms. The first floating gate layer 104 may be formed of polysilicon. The second floating gate layer 106 may be formed of a metal such as tantalum nitride, titanium nitride, etc. The hard mask layer 108 may be formed of silicon nitride. Both the first and second floating gate layers 104 and 106 may be formed by chemical vapor deposition (CVD). According to one embodiment, the combined thickness of the first and second floating gate layers 104 and 106 may be 300 Angstroms or less. For example, both the first and second floating gate layers 104 and 106 may each be formed to a thickness of 50 Angstroms.

Figure 2:
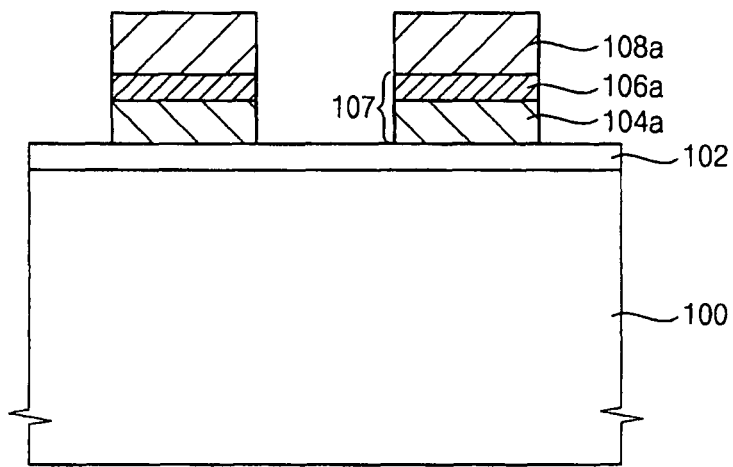

As shown in FIG. 2, the hard mask layer 108 is patterned using a resist pattern (not shown) to form a hard mask pattern 108*a*. Then, the second floating gate layer 106 and the first floating gate layer 104 are etched using the hard mask pattern 108*a* as a mask. This results in a floating gate structure 107 formed of a first floating gate 104*a* and a second floating gate 106*a*. The etching may be an isotropic dry etch.

Figure 3:
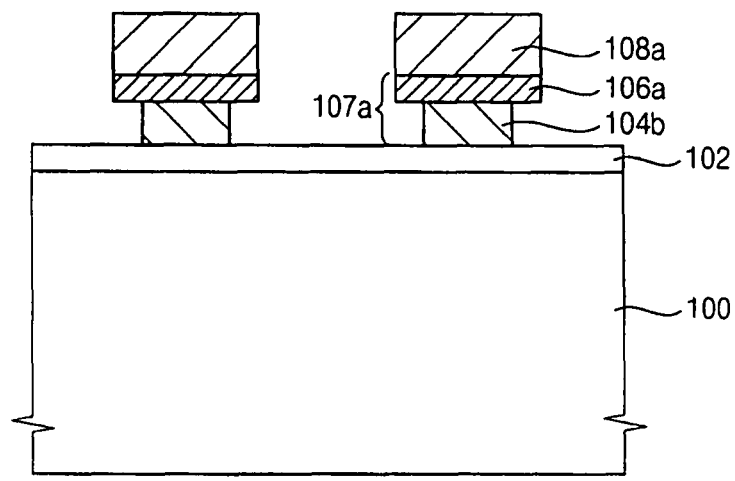

Next, as shown in FIG. 3, a further etch is carried out to undercut etch the first floating gate 104*a*. This etch may be a non-isotropic etch having etch selectivity with respect to the second floating gate 106*a* such that the first floating gate 104*a* is etched, but the second floating gate 106*a* is not. The non-isotropic etch may be a wet etch, chemical dry etch (CDE), etc. The etching in FIG. 3 results in a first floating gate 104*b* having a width that is less than a width of the second floating gate 106*a*, and the resulting floating gate structure 107*a* achieves a T shape. In one embodiment, the width of the first floating gate 104*b* is no more than 10% less than the width of the second floating gate 106*a*.

Figure 4:
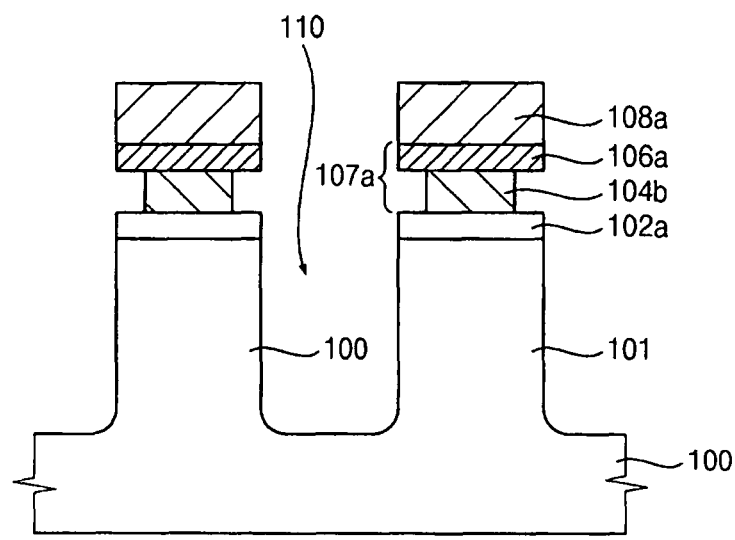

As shown in FIG. 4, a well-known shallow trench isolation (STI) process is carried out using the hard mask pattern 108*a* as a mask to first form holes 110 in the semiconductor substrate 100. Stated another way, this process forms semiconductor substrate projections 101, and results in a tunnel insulation layer 102*a* formed on each projection 101 and the floating gate structure 107*a* formed on the tunnel insulation layer 102*a*. As shown, the process results in the tunnel insulation layer 102*a* having a width greater than the first floating gate 104*b*.

Figure 5:
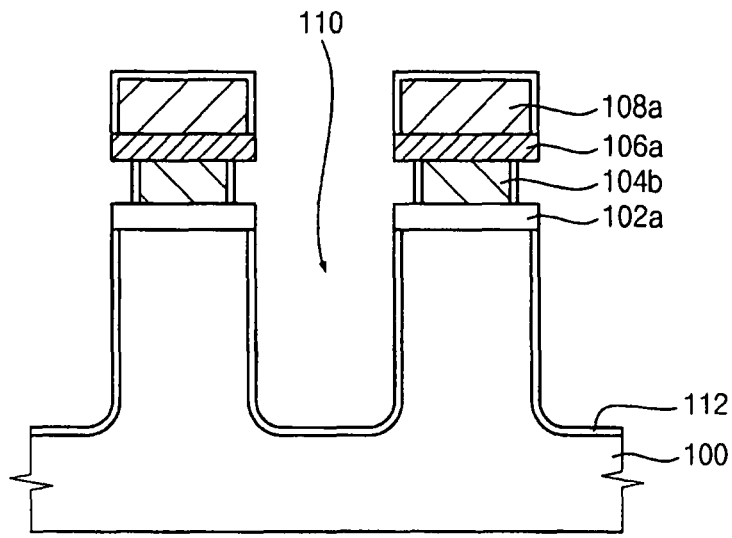

Next, as shown in FIG. 5, according to an embodiment, a thin insulating layer 112 is formed by thermal oxidation. In particular, the thermal oxidation process forms the thin insulation layer 112 on surfaces of the semiconductor substrate 100 defining the holes 110, on the sidewalls of the first floating gate 104*b*, and on the hard mask pattern 108*a*.

Figure 6:
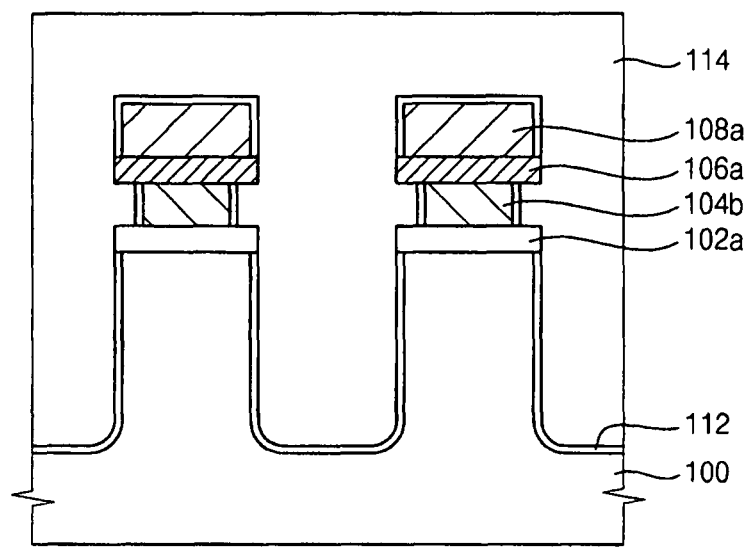
Figure 7:
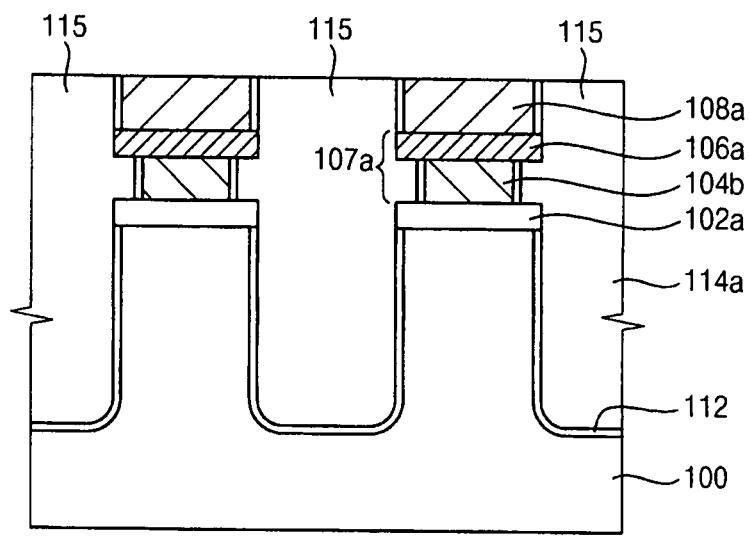

As shown in FIG. 6, an insulation layer 114 known as an STI isolation layer is formed over the semiconductor substrate 100 to completely fill the STI holes 110 and cover the floating gate structure 107*a*. The insulation layer 114 may be formed of silicon oxide having a good gap-filling characteristic such as high-density plasma (HDP) oxide, borophosphosilicate glass (BPSG), TOSZ, polysilazene, etc. As shown in FIG. 7, the insulation layer 114 is polished by, for example, chemical mechanical polishing (CMP) to form insulation layer 114*a* having an STI structure. In the CMP process, the hard mask pattern 108*a* is used as an etch stopper. Accordingly, the insulation layer 114*a* has projection 115 between which the control gate structures 107*a* are disposed.

Figure 8:
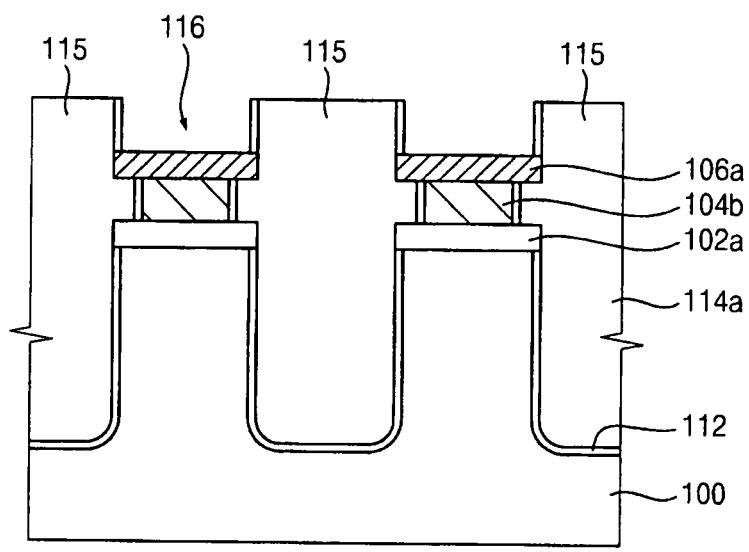

As shown in FIG. 8, the hard mask pattern 108*a* is removed. For example, the hard mask pattern may be removed by a well-known wet etch process. Removing the hard mask pattern 108*a* creates a recess 116 defined by the insulation layer 114*a*. Namely, an upper surface of the floating gate structure 107*a* is below an upper surface of the insulation layer 114*a*.

Figure 9:
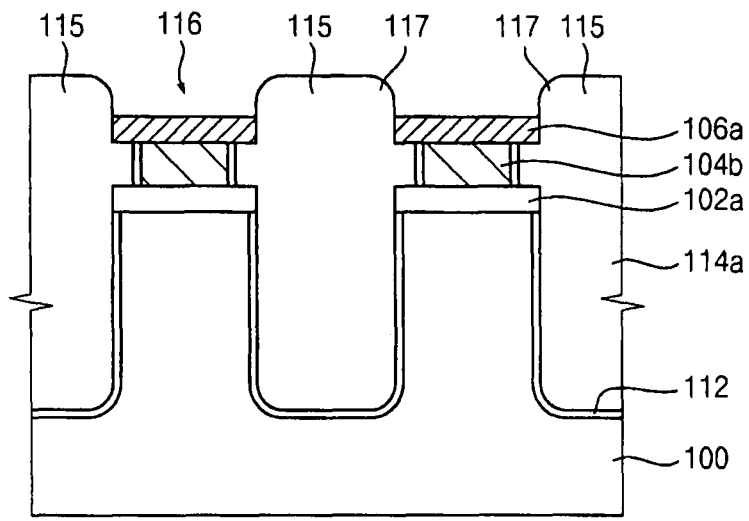

As further shown in FIG. 8, the insulation layer 112 is disposed on the sidewalls of the recess 116. This portion of the insulation layer 112 is removed by a wet cleaning process as shown in FIG. 9. The wet cleaning process also etches the insulation layer 114*a* such that the edges 117 of the upper surface of the insulation layer 114*a* become rounded. In one embodiment, the wet cleaning process may be performed using HF and/or distilled water. After the cleaning process, the upper surface of the floating gate structure 107*a* still remains below the upper surface of the insulation layer 114*a*. Namely, the insulation layer 114*a* still defines a recess 116 exposing the second floating gate 106*a*, and the floating gate structure 107*a* remains disposed between projections 115 of the insulation layer 114*a*.

Figure 10:
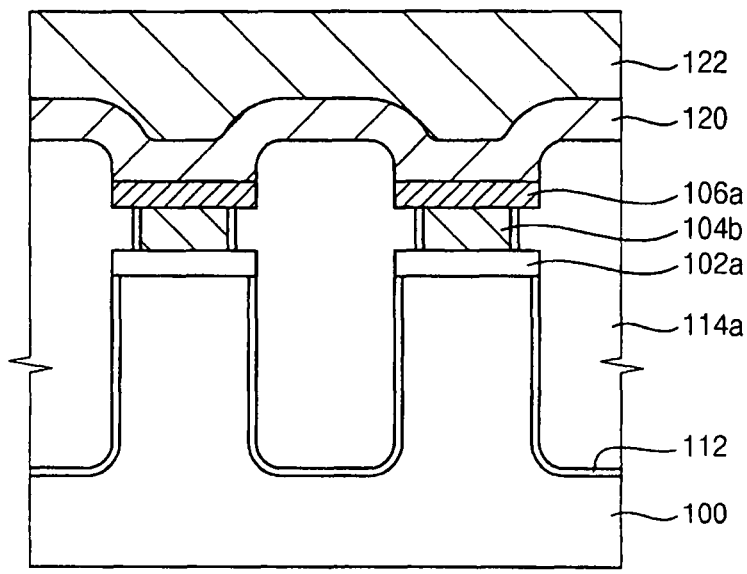

As will be appreciated from FIG. 10, a dielectric layer and conductive layer are formed over the semiconductor substrate 100. The dielectric layer covers the insulation layer 114*a* and fills the recesses 116, the conductive layer covers the dielectric layer. The dielectric layer and conductive layer may be patterned (e.g., through photolithography) to form dielectric pattern 120 and control gate 122. For example, the dielectric pattern 120 may have a strip shape. However, as shown in FIG. 10, a bottom surface of the dielectric pattern 120 includes projections 121 projecting into and filling the recesses 116 such that each the projections 121 contacts a respective second floating gate 106*a*. In one embodiment, the dielectric pattern 120 may be formed of a material having a higher dielectric constant than the first and second floating gates 104*b* and 106*a*. For example, the dielectric pattern 120 may be formed of $Al_2O_3$, $Hf_2O_3$, etc. In one embodiment, the dielectric constant of the dielectric pattern 120 may be 7 or greater. The control gate 122 may be formed of polysilicon, or the control gate 122 may be formed of or include a metal such as W, Ti, etc.

Figure 11:
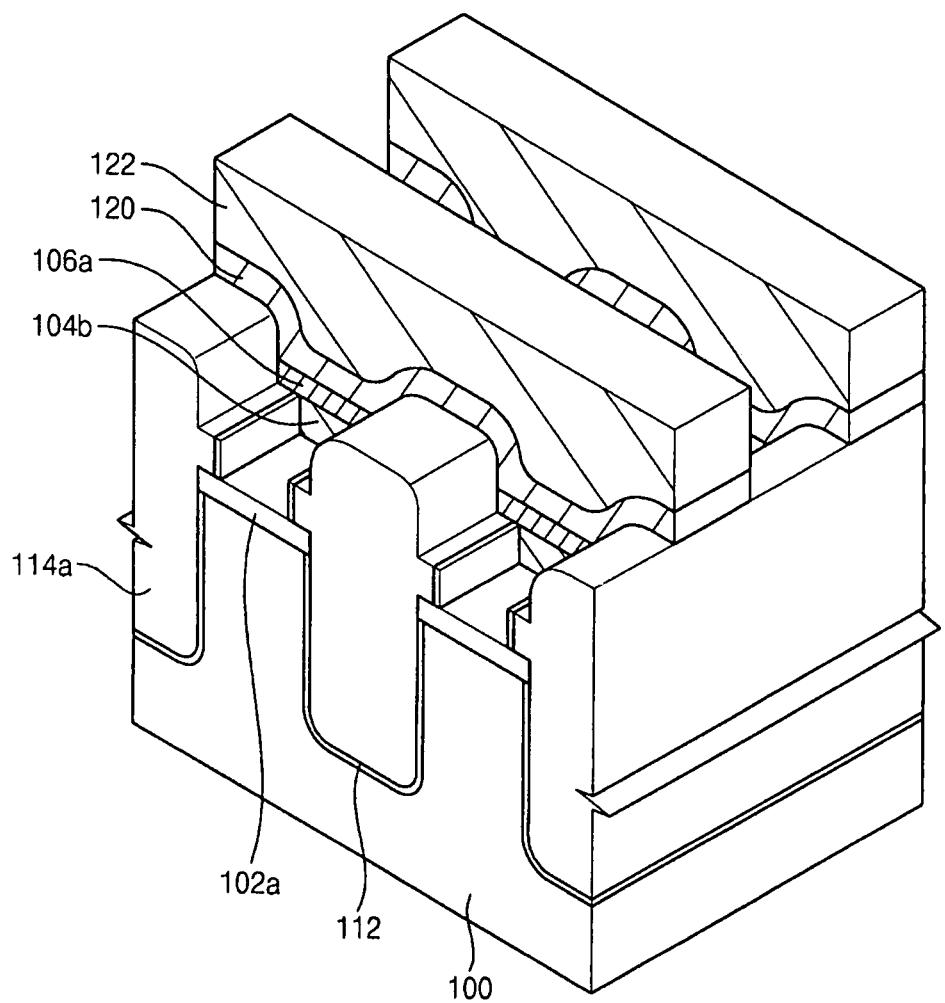
FIG. 11 illustrates a perspective view of the structure formed by the embodiment of FIGS. 1-10.
Figure 12:
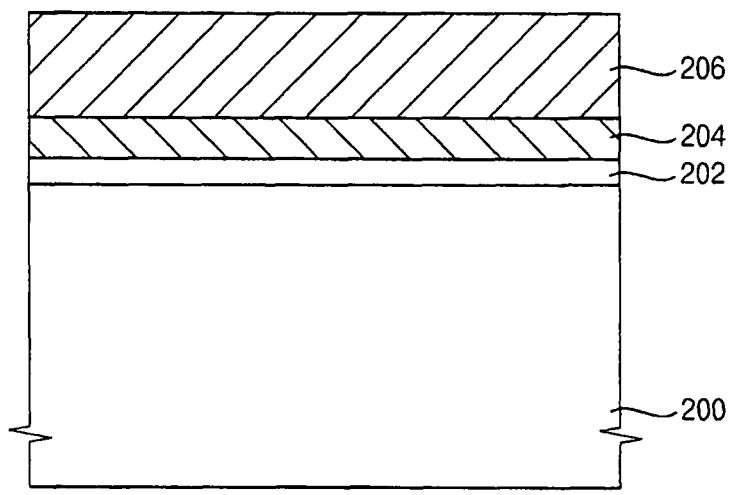
FIGS. 12-20 illustrate another example embodiment of a method for forming a semiconductor memory device.

FIG. 11 illustrates a perspective view of the structure formed in FIG. 10. As will be appreciated from FIGS. 10 and 11, because the contact area between the second floating gate 106*a* and dielectric pattern 120 is greater than the contact area between the first floating gate 104*b* and the tunnel insulation layer 102, and the dielectric pattern 120 has a higher dielectric constant than the floating gate structure 107*a*, the coupling ratio is reduced.

FIGS. 12-20 illustrate another example embodiment of a method for forming a semiconductor memory device. In particular, FIGS. 12-20 illustrate the formation of a memory cell for a non-volatile memory. As shown, in FIG. 12, a tunnel insulation layer 202, a first floating gate layer 204, and a sacrificial layer or hard mask layer 206 are sequentially formed over a semiconductor substrate 200. For example, the semiconductor substrate 200 may be a silicon substrate. The tunnel insulation layer 202 may be an oxide layer. For example, the tunnel insulation layer 202 may be a silicon oxide layer formed by thermal oxidation of the semiconductor substrate 200. The tunnel insulation layer 202 may be formed to a thickness of 80 Angstroms. The first floating gate layer 204 may be formed of polysilicon. The hard mask layer 206 may be formed of silicon nitride. The first floating gate layer 204 may be formed by chemical vapor deposition (CVD). According to one embodiment, the first floating gate layer 204 may be 50 Angstroms or less.

Figure 13:
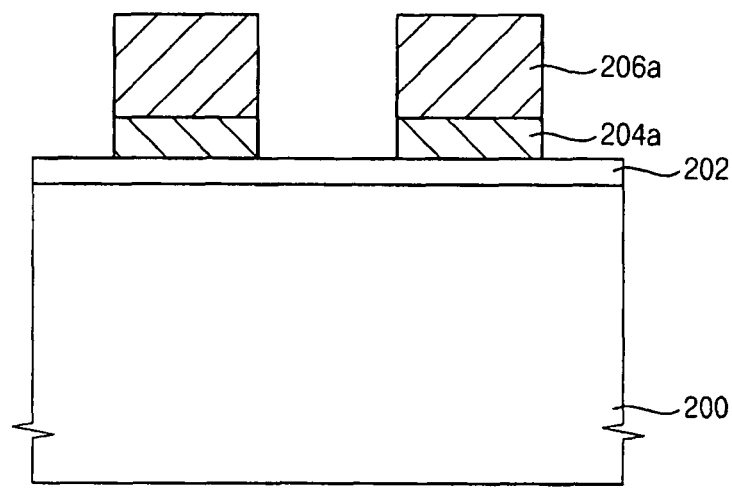

As shown in FIG. 13, the hard mask layer 206 is patterned using a resist pattern (not shown) to form a hard mask pattern 206*a*. Then, the first floating gate layer 204 is etched using the hard mask pattern 206*a* as a mask. This results in a first floating gate 204*a*. The etching may be an isotropic dry etch.

Figure 14:
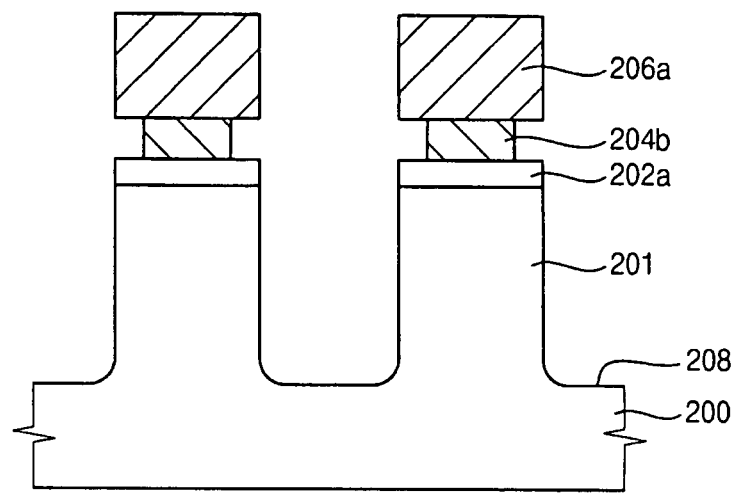

Next, as shown in FIG. 14, a further etch is carried out to undercut etch the first floating gate 204*a* and form first floating gate 204*b*. This etch may be a non-isotropic etch having etch selectivity with respect to the hard mask pattern 206*a* such that the first floating gate 104*a* is etched, but the hard mask patter 206*a* is not. The non-isotropic etch may be a wet etch, chemical dry etch (CDE), etc.

As shown in FIG. 14, a well-known shallow trench isolation (STI) process is carried out using the hard mask pattern 206*a* as a mask to first form holes 208 in the semiconductor substrate 200. Stated another way, this process forms semiconductor substrate projections 201, and results in i) a tunnel insulation layer 202a formed on each projection 201 and ii) the first floating gate 204b formed on the tunnel insulation layer 202a. As shown, the process results in the first floating gate 204b having a width less than the tunnel insulation layer 202a.

Figure 15:
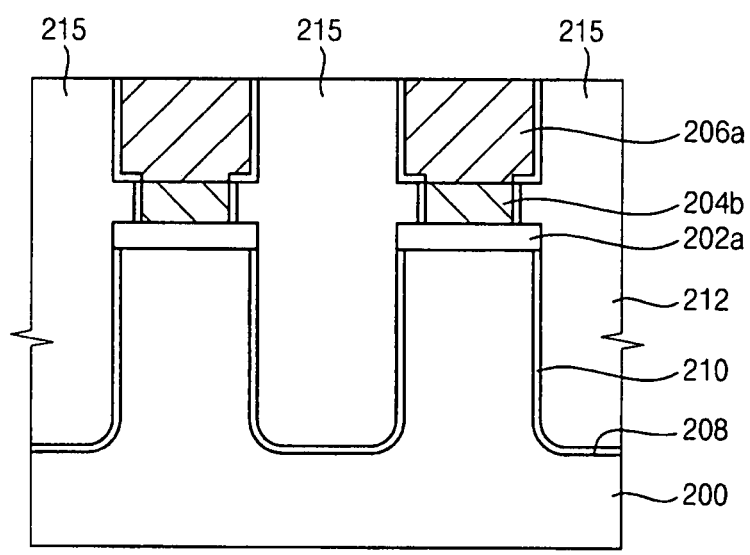

Next, as shown in FIG. 15, according to an embodiment, a thin insulating layer 210 is formed by thermal oxidation. In particular, the thermal oxidation process forms the thin insulation layer 210 on surfaces of the semiconductor substrate 200 defining the holes 208, on the sidewalls of the first floating gate 204b, and on the hard mask pattern 206a.

As shown in FIG. 15, an insulation layer 212 known as an STI isolation layer is formed over the semiconductor substrate 200 to completely fill the STI holes 208 and cover the floating gate structure formed thus far. The insulation layer 212 may be formed of silicon oxide having a good gap-filling characteristic such as high-density plasma (HDP) oxide, borophosphosilicate glass (BPSG), TOSZ, polysilazene, etc. As shown in FIG. 15, the insulation layer 212 is polished by, for example, chemical mechanical polishing (CMP) to form insulation layer 212 having an STI structure. In the CMP process, the hard mask pattern 206a is used as an etch stopper. Accordingly, the insulation layer 212 has projections 215 between which the first floating gates 204b are disposed.

Figure 16:
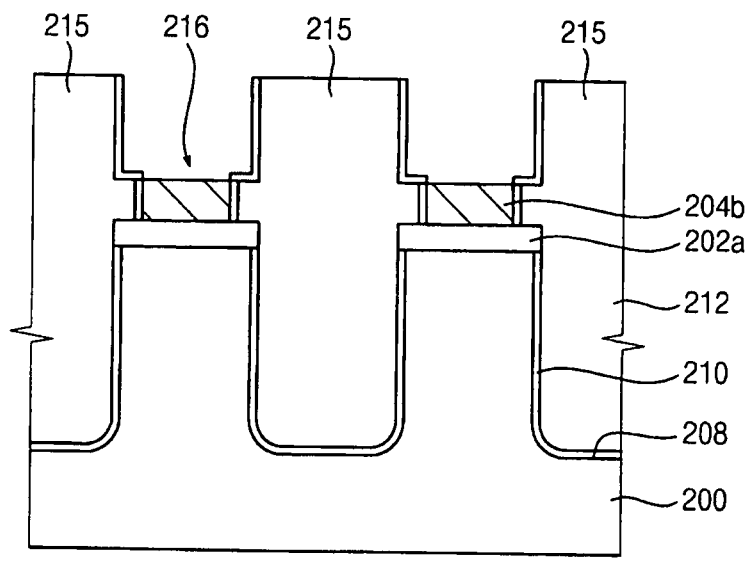

As shown in FIG. 16, the hard mask pattern 206a is removed. For example, the hard mask pattern 206a may be removed by a well-known wet etch process. Removing the hard mask pattern 206a creates a recess 216 defined by the insulation layer 212. Namely, an upper surface of the first floating gate 204b is below an upper surface of the insulation layer 212. As shown further shown in FIG. 16, the insulation layer 208 is disposed on the sidewalls of the recess 216.

Figure 17:
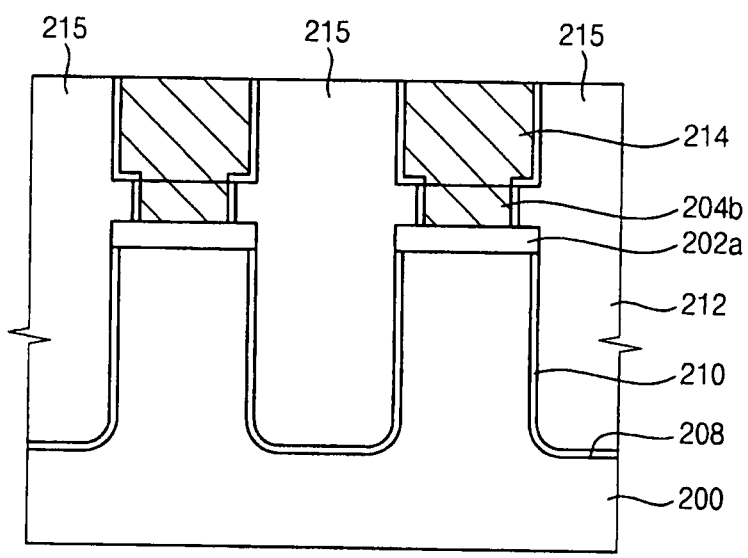

As shown in FIG. 17, a second floating gate layer 214 is formed over the substrate 200 such that the second floating gate layer 214 substantially fills the recess 216 and covers the insulation layer 212. The second floating gate layer 214 may be polysilicon, and may be deposited by CVD. A CMP process is then performed to expose the insulation layer 212. As a result, only second floating gate layer 214 disposed in the recess 216 remains.

Figure 18:
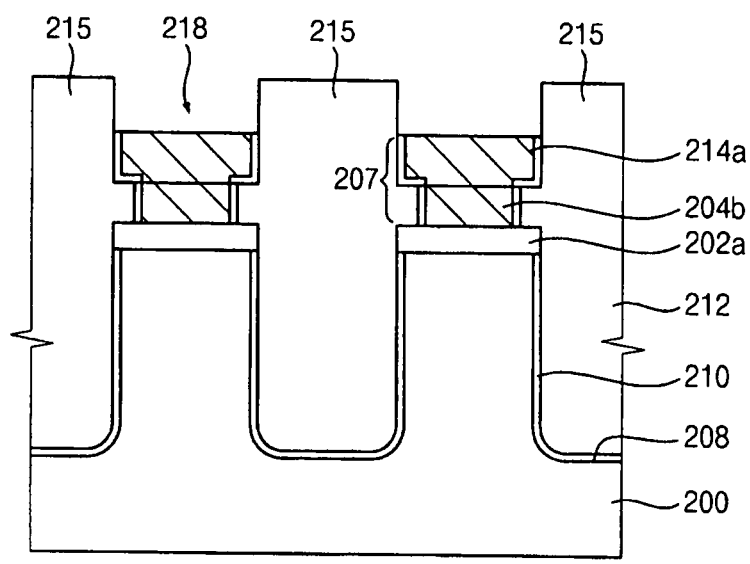

As shown in FIG. 18, the second floating gate layer 214 is etched to remove a portion of the second floating, gate layer 214 and the insulation layer 210 in the recess 216, but not to remove the entire second floating gate layer 214 and insulation layer 210 in the recess 216. As a result, a second floating gate 214a remains after the etching process. The second floating gate 214a may have a thickness of 50 Angstroms. It will be understood, however, that the thicknesses of the first and second floating gates 204b and 214a may be varied. However, it may be desirable to keep the total thickness of the first and second floating gates 204b and 214a at 300 Angstroms or less.

As further shown in FIG. 18, the etching process creates a second recess 218. The etching may be by wet or dry etching, and may have an etch selectivity with respect to the insulation layer 212. Furthermore, the process shown in FIGS. 16-18 results in the second floating gate 214a having a width that is greater than a width of the first floating gate 204b, and a resulting floating gate structure 207 achieves a T shape. In one embodiment, the width of the first floating gate 204b is no more than 10% less than the width of the second floating gate 214a. Still further, the resulting upper surface of the floating gate structure 207 (i.e., the upper surface of the second floating gate 214a) is below the upper surface of the projections 215 of the insulation layer 212.

Figure 19:
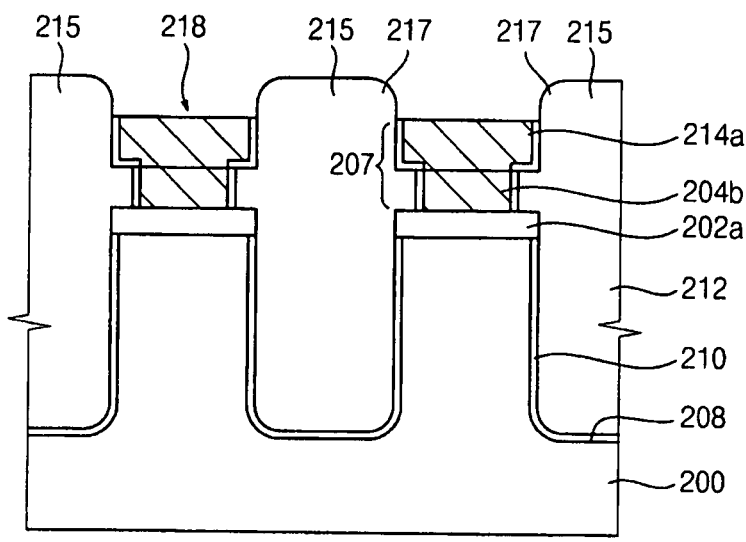

Next, as shown in FIG. 19, a wet cleaning process is performed to etch the insulation layer 212 such that the edges 217 of the upper surface of the insulation layer 212 become rounded. In one embodiment, the wet cleaning process may be performed using HF and/or distilled water. After the cleaning process, the upper surface of the floating gate structure 207 still remains below the upper surface of the insulation layer 212. Namely, the insulation layer 212 still defines a recess 218 exposing the second floating gate 214a, and the floating gate structure 207 remains disposed between projections 215 of the insulation layer 212.

Figure 20:
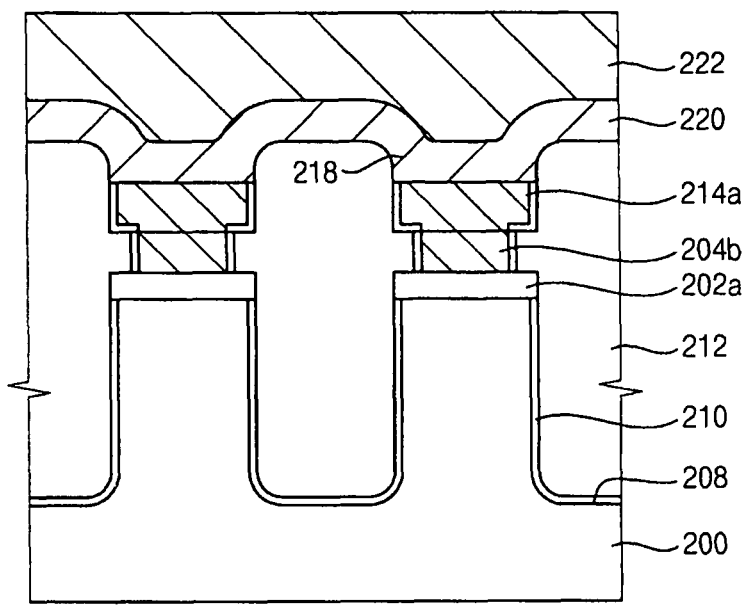

As will be appreciated from FIG. 20, a dielectric layer and conductive layer are formed over the semiconductor substrate 200. The dielectric layer covers the insulation layer 212 and fills the recesses 218, the conductive layer covers the dielectric layer. The dielectric layer and conductive layer may be patterned (e.g., through photolithography) to form dielectric pattern 220 and control gate 222. For example, the dielectric pattern 220 may have a strip shape. However, as shown in FIG. 20, a bottom surface of the dielectric pattern 220 includes projections 221 projecting into and filling the recesses 218 such that each the projections 221 contacts a respective second floating gate 214a. In one embodiment, the dielectric pattern 220 may be formed of a material having a higher dielectric constant than the first and second floating gates 204b and 214a. For example, the dielectric pattern 220 may be formed of $Al_2O_3$, $Hf_2O_3$, etc. In one embodiment, the dielectric constant of the dielectric pattern 220 may be 7 or greater. The control gate 222 may be formed of polysilicon, or the control gate 222 may be formed of or include a metal such as W, Ti, etc.

Figure 21:
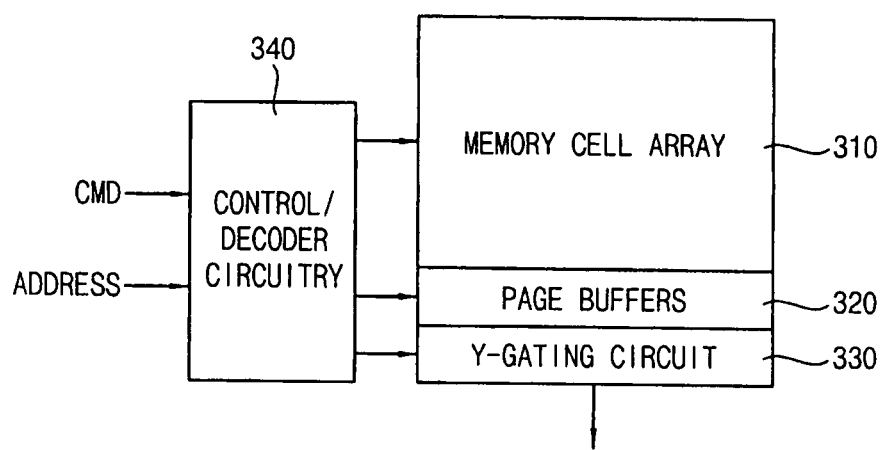
FIG. 21 illustrates a NAND flash memory according to an example embodiment.

FIG. 21 illustrates a NAND flash memory according to an embodiment of the present invention. As shown, the NAND flash memory includes a memory array 310 of memory cells to store data, a page buffer block 320, a Y-gating circuit 330 and/or control/decoder circuitry 340 for controlling the operation of the memory array 310, the page buffer block 320, and the Y-gating circuit 330. The control/decoder circuitry 340 receives command signals and an address, and generates control signals for controlling the memory array 310, the page buffer block 320, and the Y-gating circuit 330.

Figure 22:
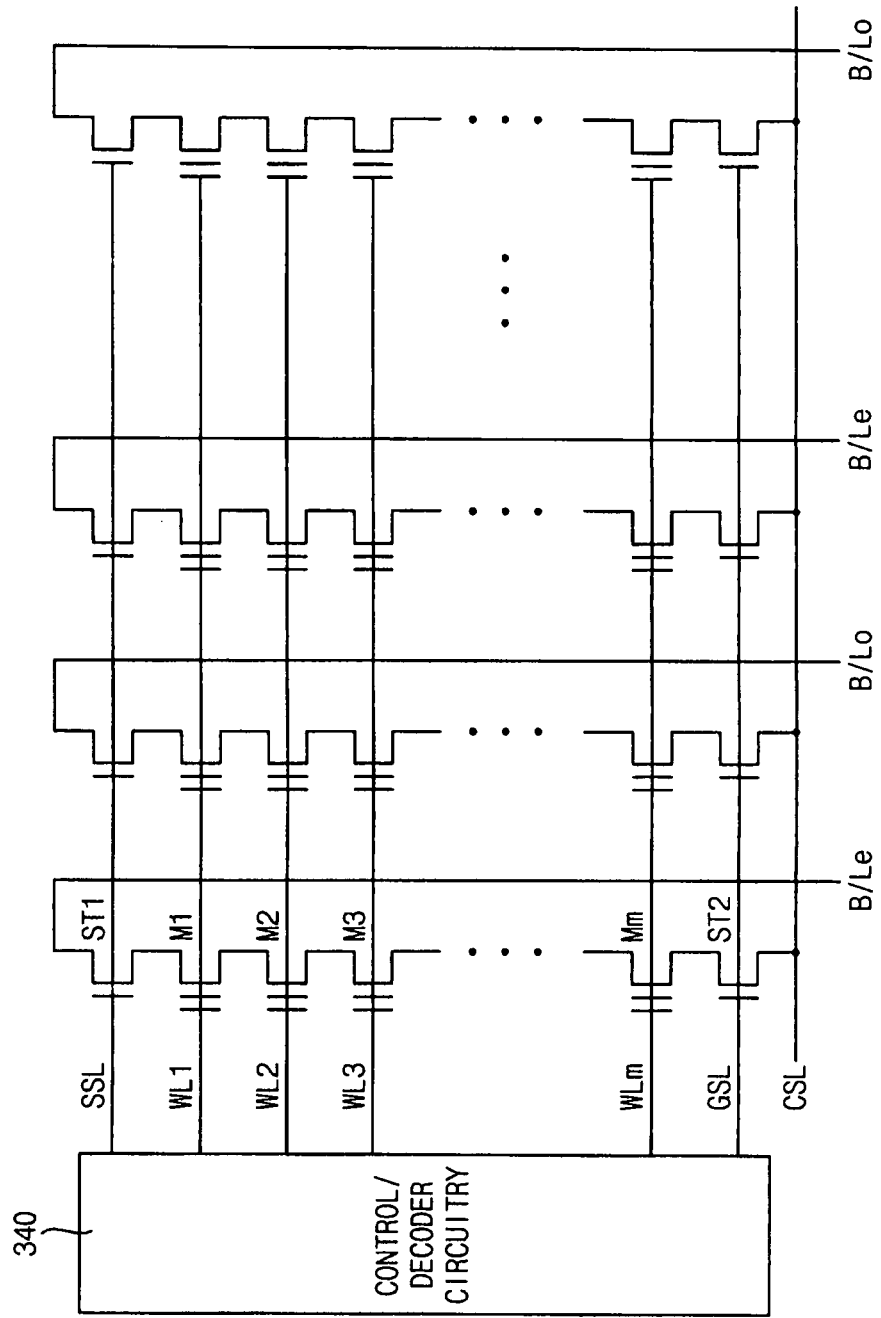
FIG. 22 illustrates an example of a portion of the memory array in the NAND flash memory of FIG. 21.

FIG. 22 illustrates an example of a portion of the memory array 310. As shown, the memory array 310 includes a plurality of bit lines B/Le, B/Lo, where "e" and "o" designate even and odd bit lines. The memory cell array 310 includes a plurality of cell strings each respectively connected to one of bit lines B/Le and B/Lo. Each cell string in the illustrated example is formed from a string selection transistor SST connected to its corresponding bit line, a ground selection transistor GST connected to a common source line CSL, and a plurality of memory cells M1-Mm connected in series between the string selection transistor SST and the ground selection transistor GST. Each memory cell M1-Mm may be formed according to one of the above described embodiments. While not shown in FIG. 22, more than one string may be connected to a bit line. Each bit line may be connected to a respective page buffer in the page buffer block 320.

The page buffer block 320 includes a plurality of page buffers for reading and writing data into the memory array 310 based on the control signals from the control/decoder circuitry 340. The Y-gating circuit 330 selects page buffers in the page buffer block 320 for input of data or output of data based on the control signals from the control/decoder circuitry 340. Because the structure and operation of the page buffer block 320, the Y-gating circuit 330 and the control/decoder circuitry 340 are so well-known, the structure and operation of these elements will not be described in detail for the sake of brevity. Instead, U.S. Pat. No. 7,042,770 illustrating an example NAND flash memory, which may employ the embodiments of the present invention, is hereby incorporated by reference in its entirety.

Furthermore, it will be appreciated that the embodiments of the present invention are not limited in application to a NAND flash memory having the architecture described above with respect to FIGS. 21-22. Instead, the embodiment of the present invention may be applied to the cell array of various NAND flash memory architectures.

Figure 23:
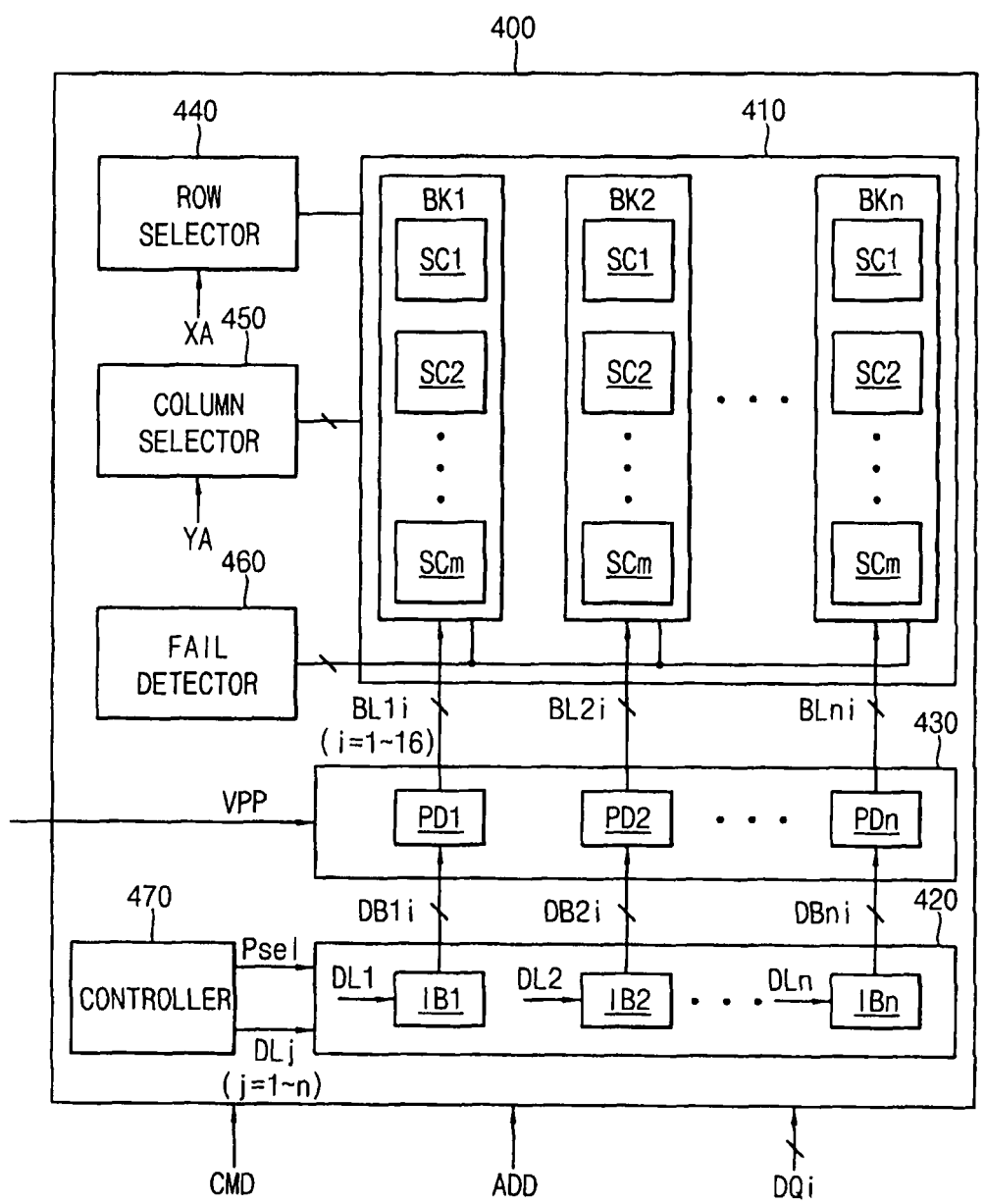
FIG. 23 illustrates a NOR flash memory according to an example embodiment.

FIG. 23 illustrates a NOR flash memory according to an embodiment of the present invention. As shown, the NOR flash memory device 400 includes a cell array 410, a row selector 440, and/or a column selector 450.

The cell array 410 is composed of a plurality of banks BK1-BKn. Each bank includes of a plurality of sectors SC1-SCm, each as a unit of erasing. Each sector is constructed of a plurality of memory cells (not shown) coupled to a plurality of wordlines and bitlines. Output lines and output circuitry are not shown in FIG. 23 so that the overall NOR flash memory device 400 is simply and clearly illustrated.

The row selector 440 selects one wordline in response to a row address XA. The column selector 450 selects 16 bitlines for every bank in response to a column address YA. The structures and operations regarding the cell array 410, the row selector 440, and the column selector 450 will be described with reference to FIG. 24 in detail.

The NOR flash memory device 400 also includes a data input buffer 420, a program driver 430, and/or a controller 470. The data input buffer 420 receives program data of 16 bits in parallel, equal to the number of banks. The program data is stored in unit buffers IB1-IBn of the input buffer 420 in units of 16 bits. The unit buffers IB1-IBn are alternatively operable under the control of data latch signals DLj (j=1.about.n). For instance, if DL1 is a high level, the first unit buffer IB1 receives 16 data bits in parallel. The receiver data is held in the first unit buffer IB1 for a time. The data input buffer 420 dumps data held in the unit buffers IB1-IBn contemporaneously to the program driver 430 when the program selection signal PSEL is a high level.

The controller 470 applies the program selection signal PSEL and the data latch signal DLj to the data input buffer 420. The data input buffer 420 may receive the program data in units of 16 bits by the number of the banks or less, alternatively or sequentially, under regulation of the controller 470.

The program driver 30 applies a program voltage contemporaneously to selected bitlines among bitline packets BL1i-BLni (i=1.about.16) in response to program data packets DB1i-DBni (i=1.about.16) stored in the data input buffer 420. The program driver includes unit drivers PD1-PDn corresponding to the unit buffers IB1-IBn. The program driver 430 is supplied with a high voltage VPP from an external power source that is greater than the (internal) power source voltage. The high voltage VPP from the external source is used for supplying a drain voltage and a cell current of a selected cell transistor in a program operation. Otherwise, it may be possible to supply the high voltage VPP internally by using a charge pump circuit (not shown) embedded in the NOR flash memory device.

The NOR flash memory device 400 also includes a fail detector 460. The fail detector senses data stored in the cell array 410 and then detects a failure of programming by comparing the sense data with the program data stored in the data input buffer 420. The fail detector 460 is shared by all the banks of the cell array 410.

As illustrated in FIG. 23, the NOR flash memory device 400 receives command signals CMD, address signals ADD, data DQi, and the high voltage VPP. For example, these signals may be supplied from a host device or memory controller.

Figure 24:
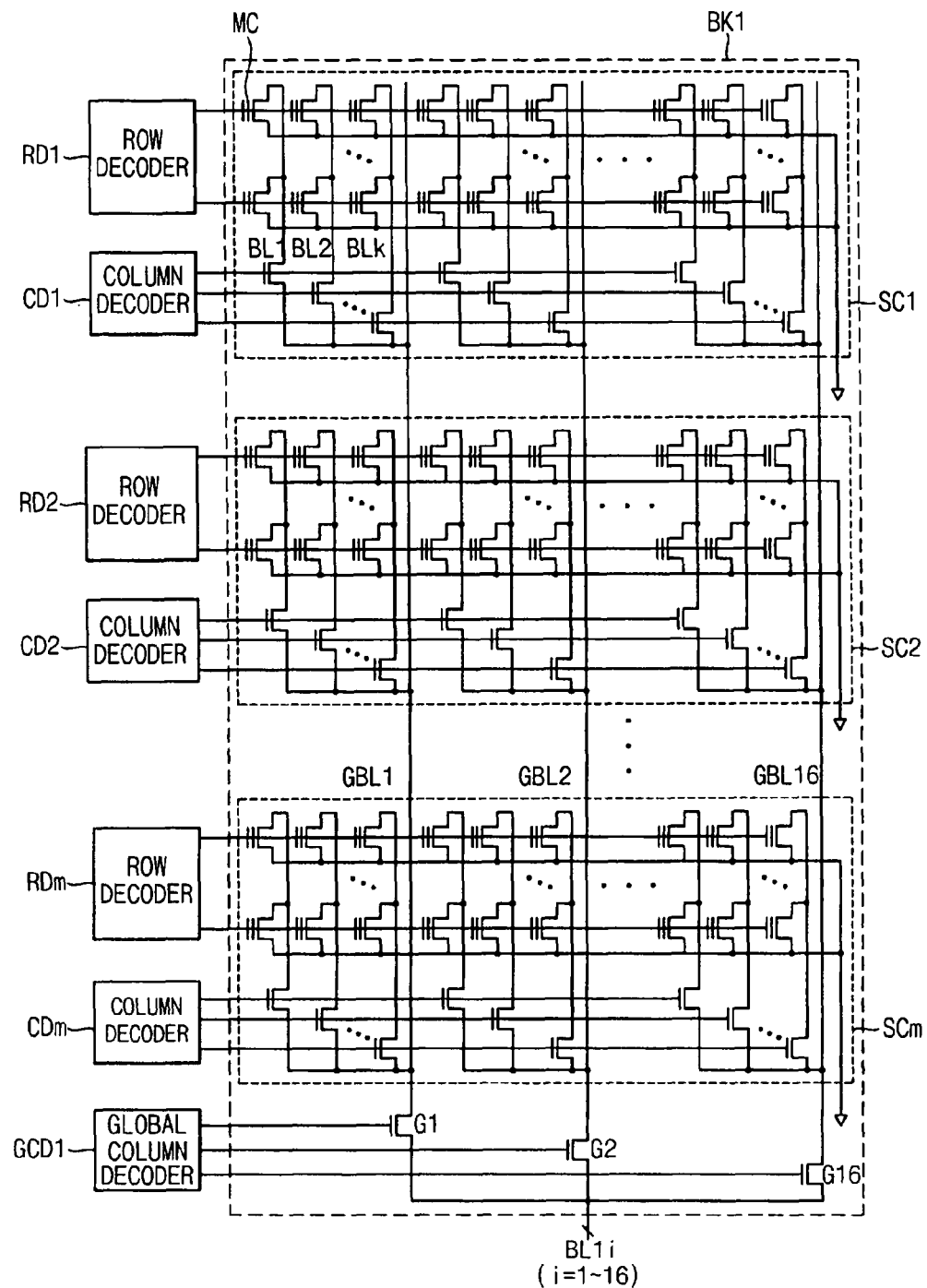
FIG. 24 illustrates a circuit pattern of the first bank BK1 as an example associated with the row and column selectors and the peripherals, shown in FIG. 23.

FIG. 24 illustrates a circuit pattern of the first bank BK1 as an example associated with the row and column selectors and the peripherals, shown in FIG. 23. The row selector 440 includes a plurality of row decoders RD1-RDm while the column selector 450 includes a plurality of column decoders CD1-CDm. Pairs of the row and column decoders correspond each to the sectors SC1-SCm. The column selector 450 is further comprised of a global column decoder GCD1 arranged corresponding to the first bank BK1.

Referring to FIG. 24, in the first bank BK1 composed of the plurality of sectors SC1-SCm, each of which forms the erase unit, the first sector SC1 is coupled to the row decoder RD1 for driving a wordline assigned to a selected memory cell MC and the column decoder for selecting the bitlines BL1-BLk that are assigned to a global bitline (e.g., GBL1). The memory cells MC may be formed according to an embodiment of the present invention. The global bitlines are exemplarily arranged in numbers of 16, so that each of the global bitlines GBL1-GBL16 is linked with the bitlines BL1-BLk (preferably namable as local bitlines relative to the global bitlines) through their corresponding column gate transistors in every sector. The column gate transistors are controlled by the column decoder corresponding thereto. Other sectors are disposed with the same connected feature as the first sector SC1.

The global bitlines GBL1.about.GBL16 are lead from one (e.g., BL1i) of the bitline packets BL1i.about.BLni provided by the program driver 30, each by way of selection transistors G1.about.G16 controlled by the global column decoder GCD1. As a result, the memory cell array is constructed in a hierarchical architecture with the local bitlines each connected to the memory cells along columns and the global bitlines each connected to a group of the local bitlines.

Because the operation and further detailed structure of the NOR flash memory illustrated in FIGS. 23-24 is well-known, further description will not be provided for the sake of brevity. Instead, U.S. Pat. No. 7,072,214 illustrating an example NOR flash memory, which may employ the embodiments of the present invention, is hereby incorporated by reference in its entirety.

Furthermore, it will be appreciated that the embodiments of the present invention are not limited in application to a NOR flash memory having the architecture described above with respect to FIGS. 23-24. Instead, the embodiment of the present invention may be applied to the cell array of various NOR flash memory architectures.

Figure 25:
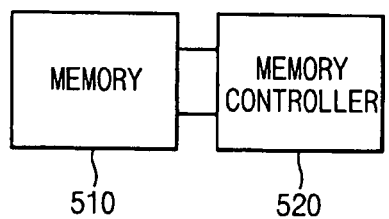
FIGS. 25-30 illustrate additional example embodiments employing a memory cell according to example embodiments.

FIG. 25 illustrates another embodiment. As shown, this embodiment includes a memory 510 connected to a memory controller 520. The memory 510 may be the NAND flash memory or NOR flash memory discussed above. However, the memory 510 is not limited to these memory architectures, and may be any memory architecture having memory cells formed according to an embodiment of the present invention. The memory controller 520 supplies the input signals for controlling operation of the memory 510. For example, in the case of the NAND flash memory of FIGS. 21-22, the memory controller 520 supplies the command CMD and address signals. In the example of the NOR flash memory of FIGS. 23-24, the memory controller 520 supplies the CMD, ADD, DQ and VPP signals. It will be appreciated that the memory controller 520 may control the memory 510 based on received control signals (not shown).

Figure 26:
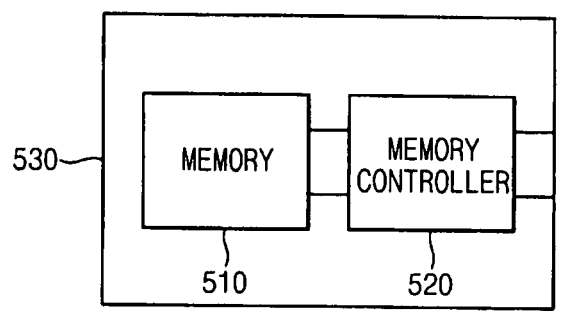

FIG. 26 illustrates yet another embodiment. This embodiment is the same as the embodiment of FIG. 25, except that the memory 510 and memory controller 520 have been embodied as a card 530. For example, the card 530 may be a memory card such as a flash memory card. Namely, the card 530 may be a card meeting any industry standard for use with a consumer electronics device such as a digital camera, personal computer, etc. It will be appreciated that the memory controller 520 may control the memory 510 based on controls signals received by the card 530 from another (e.g., external) device.

Figure 27:
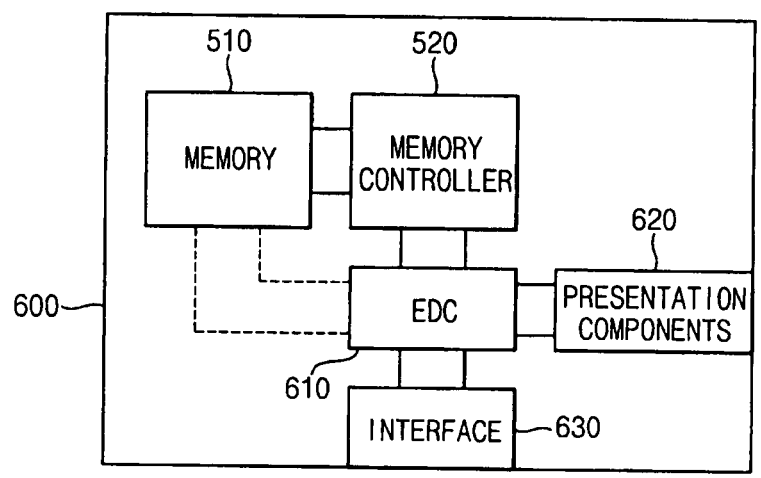

FIG. 27 illustrates a further embodiment. This embodiment represents a portable device 600. The portable device 600 may be an MP3 player, video player, combination video and audio player, etc. As shown, the portable device 600 includes the memory 510 and memory controller 520. The portable device 600 may also includes an encoder and decoder 610, presentation components 620 and interface 630.

Data (video, audio, etc.) is input to and output from the memory 510 via the memory controller 520 by an encoder and decoder (EDC) 610. As shown by the dashed lines in FIG. 27, the data may be directly input to the memory 510 from the EDC 610 and/or directly output from the memory 510 to the EDC 610.

The EDC 610 encodes data for storage in the memory 510. For example, the EDC 610 may perform MP3 encoding on audio data for storage in the memory 510. Alternatively, the EDC 610 may perform MPEG encoding (e.g., MPEG2, MPEG4, etc.) on video data for storage in the memory 510. Still further, the EDC 610 may include multiple encoders for encoding different types of data according to different data formats. For example, the EDC 610 may include an MP3 encoder for audio data and an MPEG encoder for video data.

The EDC 610 may decode output from the memory 510. For example, the EDC 610 may perform MP3 decoding on audio data output from the memory 510. Alternatively, the EDC 610 may perform MPEG decoding (e.g., MPEG2, MPEG4, etc.) on video data output from the memory 510. Still further, the EDC 610 may include multiple decoders for decoding different types of data according to different data formats. For example, the EDC 610 may include an MP3 decoder for audio data and an MPEG decoder for video data.

It will also be appreciated that EDC 610 may include only decoders. For example, already encoded data may be received by the EDC 610 and passed to the memory controller 520 and/or the memory 510.

The EDC 610 may receive data for encoding, or receive already encoded data, via the interface 630. The interface 630 may conform to a known standard (e.g., firewire, USB, etc.). The interface 630 may also include more than one interface. For example, interface 630 may include a firewire interface, a USB interface, etc. Data from the memory 510 may also be output via the interface 630.

The presentation components 620 may present data output from the memory, and/or decoded by the EDC 610, to a user. For example, the presentation components 620 may include a speaker jack for outputting audio data, a display screen for outputting video data, and/or etc.

Figure 28:
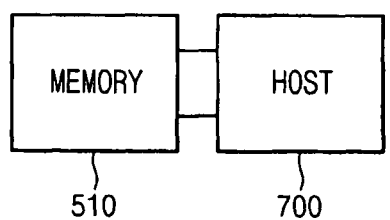

FIG. 28 illustrates a still further embodiment of the present invention. As shown, the memory 510 may be connected with a host system 700. The host system 700 may be a processing system such as a personal computer, digital camera, etc. The host system 700 may use the memory 510 as a removable storage medium. As will be appreciated, the host system 700 supplies the input signals for controlling operation of the memory 510. For example, in the case of the NAND flash memory of FIGS. 21-22, the host system 700 supplies the command CMD and address signals. In the example of the NOR flash memory of FIGS. 23-24, the host system 700 supplies the CMD, ADD, DQ and VPP signals.

Figure 29:
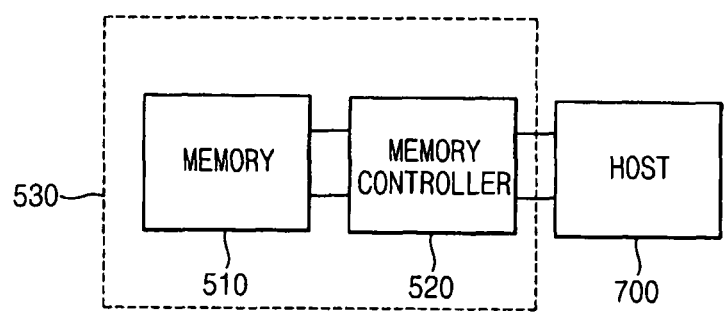

FIG. 29 illustrates an embodiment of the present invention in which the host system 700 is connected to the card 530 of FIG. 26. In this embodiment, the host system 700 applies control signals to the card 530 such that the memory controller 520 controls operation of the memory 510.

Figure 30:
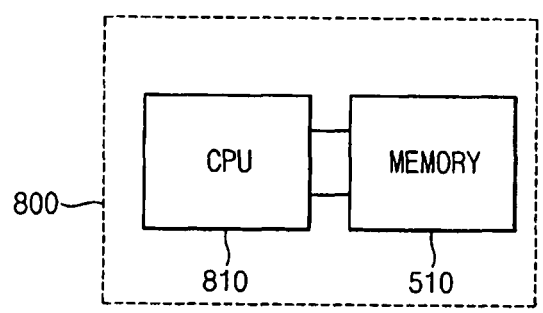

FIG. 30 illustrates a further embodiment of the present invention. As shown, the memory 510 may be connected to a central processing unit (CPU) 810 within a computer system 800. For example, the computer system 800 may be a personal computer, personal data assistant, etc. The memory 510 may be directly connected with the CPU 810, connected via bus, etc. It will be appreciated, that FIG. 30 does not illustrate the full complement of components that may be included within a computer system 800 for the sake of clarity.

The invention being thus described, it will be obvious that the same may be varied in many ways. Such variations are not to be regarded as a departure from the invention, and all such modifications are intended to be included within the scope of the invention.

We claim:

1. A semiconductor memory device, comprising:
a semiconductor substrate having projecting portions;
a tunnel insulation layer formed over at least one of the projecting semiconductor substrate portions;
a floating gate structure disposed over the tunnel insulation layer, an upper portion of the floating gate structure being wider than a lower portion of the floating gate structure, and the lower portion of the floating gate structure having a width less than a width of the tunnel insulating layer;
first insulation layer portions formed in the semiconductor substrate and projecting from the semiconductor substrate such that the floating gate structure is disposed between the projecting first insulation layer portions;
a dielectric layer formed over the first insulation layer portions and the floating gate structure; and
a control gate formed over the dielectric layer,
wherein the upper portion of the floating gate structure is formed of a different material than the lower portion of the floating gate structure.

2. The device of claim 1, wherein an upper surface of the floating gate structure is below an upper surface of the first insulation layer portions.

3. The device of claim 1, wherein the projecting first insulation layer portions define a recess located above the upper portion of the floating gate structure, the recess exposing the upper portion of the floating gate structure, and the dielectric layer is formed over the first insulation layer portions and the floating gate structure such that the dielectric layer is formed in at least a portion of the recess.

4. The device of claim 1, wherein the floating gate structure has a thickness less than 300 Angstroms.

5. The device of claim 1, wherein the upper portion of the floating gate structure includes one of tantalum and titanium.

6. The device of claim 5, wherein the lower portion of the floating gate structure includes polysilicon.

7. The device of claim 1, wherein the lower portion of the floating gate structure includes polysilicon.

8. The device of claim 1, wherein the lower portion and upper portion of the floating gate structure form a T shape.

9. The device of claim 1, further comprising:
insulating sidewalls formed on sidewalls of the lower portion of the floating gate structure, and not on sidewalls of the upper portion of the floating gate structure.

10. The device of claim 1, wherein the upper portion of the floating gate structure include polysilicon.

11. The device of claim 1, further comprising:
insulating sidewalls formed on sidewalls of the lower portion of the floating gate structure and on sidewalls of the upper portion of the floating gate structure.

12. The device of claim 1, wherein a width of the lower portion of the floating gate structure is no more than 10% less than a width of the upper portion of the floating gate structure.

13. The device of claim 1, wherein a dielectric constant of the dielectric layer is greater than a dielectric constant of the floating gate structure.

14. The device of claim 13, wherein the dielectric constant is of the dielectric layer is greater than or equal to 7.

15. The device of claim 1, wherein the dielectric layer includes one of aluminum and hafnium.

16. The device of claim 1, wherein edges of an upper surface of the projecting first insulating layer portions are rounded.

17. The device of claim 1, wherein the insulating layer portions include TOSZ.

18. The device of claim 1, wherein the upper portion of the floating gate structure is formed of a material with a different etch selectivity than the lower portion of the floating gate structure.

19. A semiconductor memory device, comprising:
a semiconductor substrate;
a floating gate structure disposed over the substrate, and an upper portion of the floating gate structure being wider than a lower portion of the floating gate structure;
first insulation layer portions formed in the semiconductor substrate and projecting from the semiconductor substrate such that the floating gate structure is disposed between the projecting first insulation layer portions, and an upper surface of the floating gate structure being below an upper surface of the projecting first insulation layer portions;
a dielectric layer formed over the first insulation layer portions and the floating gate structure; and
a control gate formed over the dielectric layer,
wherein the upper portion of the floating gate structure is formed of a different material than the lower portion of the floating gate structure.

20. The semiconductor device of claim 19, wherein the upper portion of the floating gate structure is formed of a material with a different etch selectivity than the lower portion of the floating gate structure.

21. A semiconductor memory device, comprising:
a semiconductor substrate;
a floating gate structure disposed over the substrate, and an upper portion of the floating gate structure being wider than a lower portion of the floating gate structure;
first insulation layer portions formed in the semiconductor substrate and projecting from the semiconductor substrate such that the floating gate is disposed between the projecting first insulation layer portions, and the projecting first insulation layer portions defining a recess located above the upper portion of the floating gate structure, the recess exposing the upper portion of the floating gate structure;
a dielectric layer formed over the first insulation layer portions and the floating gate structure such that the dielectric layer is formed in at least a portion of the recess; and
a control gate formed over the dielectric layer,
wherein the upper portion of the floating gate structure is formed of a different material than the lower portion of the floating gate structure.

22. The semiconductor device of claim 21, wherein the upper portion of the floating gate structure is formed of a material with a different etch selectivity than the lower portion of the floating gate structure.

23. A memory device, comprising:
a memory array including an array of memory cells, each memory cell including,
a semiconductor substrate having projecting portions,
an tunnel insulation layer formed over at least one of the projecting semiconductor substrate portions,
a floating gate structure disposed over the tunnel insulation layer, an upper portion of the floating gate structure being wider than a lower portion of the floating gate structure, and the lower portion of the floating gate structure having a width less than a width of the tunnel insulating layer,
first insulation layer portions formed in the semiconductor substrate and projecting from the semiconductor substrate such that the floating gate structure is disposed between the projecting first insulation layer portions,
a dielectric layer formed over the first insulation layer portions and the floating gate structure, and
a control gate formed over the dielectric layer; and
control circuitry configured to read data from and write data to the memory array,
wherein the upper portion of the floating gate structure is formed of a different material than the lower portion of the floating gate structure.

24. The memory device of claim 23, wherein the memory array has a NAND architecture.

25. The memory device of claim 23, wherein the memory array has a NOR architecture.

26. The memory device of claim 23, wherein the upper portion of the floating gate structure is formed of a material with a different etch selectivity than the lower portion of the floating gate structure.

27. A memory system, comprising:
a memory device, the memory device including,
a memory array including an array of memory cells, each memory cell including,
a semiconductor substrate having projecting portions,
an tunnel insulation layer formed over at least one of the projecting semiconductor substrate portions,
a floating gate structure disposed over the tunnel insulation layer, an upper portion of the floating gate structure being wider than a lower portion of the floating gate structure, and the lower portion of the floating gate structure having a width less than a width of the tunnel insulating layer,
first insulation layer portions formed in the semiconductor substrate and projecting from the semiconductor substrate such that the floating gate structure is disposed between the projecting first insulation layer portions,
a dielectric layer formed over the first insulation layer portions and the floating gate structure, and
a control gate formed over the dielectric layer;
control circuitry configured to read data from and write data to the memory array; and
a memory controller, the memory controller configured to control the memory device,
wherein the upper portion of the floating gate structure is formed of a different material than the lower portion of the floating gate structure.

28. The memory system of claim 27, wherein the memory device and memory controller are housed in a card.

29. The memory system of claim 27, further comprising:
a decoder configured to decode data read from the memory device.

30. The memory system of claim 29, further comprising:
at least one presentation component configured to present the decoded data.

31. The memory system of claim 27, wherein the memory controller is configured to interface with a host device.

32. The memory system of claim 27, wherein the upper portion of the floating gate structure is formed of a material with a different etch selectivity than the lower portion of the floating gate structure.

33. A processing system, comprising:
a central processing unit;
a memory device operatively connected to the central processing system, the memory device including,
a memory array including an array of memory cells, each memory cell including,
a semiconductor substrate having projecting portions,
an tunnel insulation layer formed over at least one of the projecting semiconductor substrate portions,
a floating gate structure disposed over the tunnel insulation layer, an upper portion of the floating gate structure being wider than a lower portion of the floating gate structure, and the lower portion of the floating gate structure having a width less than a width of the tunnel insulating layer,
first insulation layer portions formed in the semiconductor substrate and projecting from the semiconductor substrate such that the floating gate structure is disposed between the projecting first insulation layer portions,
a dielectric layer formed over the first insulation layer portions and the floating gate structure, and
a control gate formed over the dielectric layer; and
control circuitry configured to read data from and write data to the memory array,
wherein the upper portion of the floating gate structure is formed of a different material than the lower portion of the floating gate structure.

34. The processing system of claim 33, wherein the upper portion of the floating gate structure is formed of a material with a different etch selectivity than the lower portion of the floating gate structure.

\* \* \* \* \*